(12) United States Patent
Mack

(10) Patent No.: US 9,846,287 B2
(45) Date of Patent: Dec. 19, 2017

(54) METHOD OF COOLING STACKED, PLUGGABLE OPTICAL TRANSCEIVERS

(71) Applicant: Ciena Corporation, Hanover, MD (US)

(72) Inventor: Bonnie Lynne Mack, Carp (CA)

(73) Assignee: Ciena Corporation, Hanover, MD (US)

( * ) Notice: Subject to any disclaimer, the term of this patent is extended or adjusted under 35 U.S.C. 154(b) by 752 days.

(21) Appl. No.: 14/329,492

(22) Filed: Jul. 11, 2014

(65) Prior Publication Data

US 2015/0013936 A1    Jan. 15, 2015

Related U.S. Application Data

(60) Provisional application No. 61/845,134, filed on Jul. 11, 2013.

(51) Int. Cl.
*G02B 6/42* (2006.01)
*H05K 7/20* (2006.01)
*F28D 15/02* (2006.01)
*F28F 1/32* (2006.01)

(52) U.S. Cl.
CPC ....... *G02B 6/4269* (2013.01); *F28D 15/0275* (2013.01); *F28F 1/32* (2013.01); *H01L 2924/0002* (2013.01); *H05K 7/20336* (2013.01)

(58) Field of Classification Search
CPC ... G02B 6/4266–6/4273; G02B 6/4201; G06F 1/20; G06F 2200/201; F28D 15/02; F28D 15/0275; F28F 1/32; H01L 2924/0002
USPC .......... 361/679.46–679.54, 688–723
See application file for complete search history.

(56) References Cited

U.S. PATENT DOCUMENTS

| | | | | |
|---|---|---|---|---|
| 5,699,853 A * | 12/1997 | Goth | ...................... | H01L 23/427 165/104.21 |
| 6,822,860 B2 * | 11/2004 | Owens | ................... | G02B 6/293 165/104.33 |
| 7,764,504 B2 * | 7/2010 | Phillips | ................ | G02B 6/4246 165/80.2 |
| 8,035,973 B2 * | 10/2011 | McColloch | ........ | G02B 6/4201 361/704 |
| 8,449,203 B2 * | 5/2013 | Downs | ................ | G02B 6/4269 361/707 |
| 9,518,785 B2 * | 12/2016 | Szczesny | ............ | F28D 15/0275 |
| 2014/0160679 A1 * | 6/2014 | Kelty | ................ | H05K 7/20672 361/700 |
| 2016/0093996 A1 * | 3/2016 | Phillips | .................. | H01R 24/60 439/487 |

* cited by examiner

*Primary Examiner* — Zachary M Pape
(74) *Attorney, Agent, or Firm* — Clements Bernard Walker PLLC; Christopher L. Bernard; Lawrence A. Baratta, Jr.

(57) ABSTRACT

An optical transceiver cooling assembly includes stacked cages mounted to a PCB. A heat radiator also is mounted on the PCB. Cooling devices (e.g., heat pipes) are coupled to the heat radiator and at least one of the cages. In some embodiments, the cages may include a divider that extends beyond the cage and is coupled to at least one of the cooling devices outside the cage. In some embodiments, the cooling devices extend into the cage and may be coupled together.

18 Claims, 4 Drawing Sheets

METHOD OF COOLING STACKED, PLUGGABLE OPTICAL TRANSCEIVERS

CROSS-REFERENCE TO RELATED APPLICATION

The present application for patent claims the benefit of U.S. Provisional Application No. 61/845,134, entitled "METHOD OF COOLING STACKED, PLUGGABLE OPTICAL TRANSCEIVERS," filed Jul. 11, 2013, assigned to the assignee hereof, and expressly incorporated herein by reference in its entirety.

FIELD OF DISCLOSURE

Aspects of the present disclosure relate generally to transceivers, and more particularly, to cooling stacked, pluggable optical transceivers.

BACKGROUND

Optical transceivers, optical transponders, fiber optic transceiver modules, optoelectronic modules, and the like are commonly used to transmit and receive digital and/or analog data over fiber optic cables. These devices come in different shapes and sizes, which are a function of the operating bandwidth. Higher powered devices typically provide more bandwidth and function at higher speeds. Along with higher speeds and greater bandwidth, however, comes increasing optical transceiver power dissipation. This is important because optical transceivers have temperature operating limits that are affected by the amount of power that they dissipate.

As described above, optical transceivers, fiber optic transceiver modules, optoelectronic modules, and the like come in different shapes and sizes. That is, they have different form factors. Common form factors include C Form-Factor Pluggable (CFP), CFP2, Small Form-Factor Pluggable (SFP) enhanced Small Form-Factor Pluggable (SFP+), Quad (4-channel) Small Form-Factor Pluggable (QSFP), QSFP+, 100 Form-Factor Pluggable (CXP), 10 Form-Factor Pluggable (XFP), and the like.

The optical transceiver industry tends to be divided into two sectors. One sector is the telecommunications environment, such as telecommunication central offices. The other sector is the data communication environment, such as data centers.

In the telecommunication environment very high reliability of equipment is traditionally demanded so that if there is power outage in the telecommunication service area people can still access their telephone to call 911. As a result, there are various requirements that are called for of the equipment provided. For example, optical transceivers have to meet a fairly high operating temperature in the event of a power outage and a failure of air conditioning systems. The equipment must remain operational for up to 96 hours with an air inlet temperature of 50° C. since during a power outage the room air conditioning is no longer working, but the equipment is operating on battery back-up. This can be difficult as devices dissipate more and more power.

They also should have long term reliability. One potential obstacle to long term reliability is unfiltered air potentially entering the telecommunication equipment. Unfiltered air can allow dust to enter circuit boards in the equipment and cause shorts. As a result, in the telecommunication environment having unfiltered air potentially entering the telecommunication equipment is problematic.

In the data communication environment, the demand for reliability is not as great as it is in the telecommunication environment. The maximum operating temperature requirements are lower, 40° C. instead of 50° C., and data communication equipment does not require filtered air for cooling the system. As a result, the data communication equipment is designed a little differently. In the data communication environment, systems commonly have cool air coming in the front and warm air exiting at the back. To accomplish this, the systems have holes at the front or faceplate of the optical equipment to allow the air to enter the equipment. The air is unfiltered, however. It stands to reason that optical equipment suppliers prefer to design devices according to the less stringent demands of data communications. However, unfiltered air is unsuitable for telecommunication system operators. That is, faceplate cooling is not acceptable in telecommunication environments.

Cooling optical transceivers are becoming more troublesome in the telecommunication environment because the devices nowadays are exceeding specified operating powers in order to achieve higher speeds and higher bandwidth.

Optical device suppliers have developed cooling solutions to meet thermal requirements in data communication environments but which do not meet thermal requirements in telecommunication environments. Also, the thermal solutions tend to work for single height optical solutions as opposed to stacked optical solutions.

For example, QSFP and CXP devices are typically mounted in what is called a belly-to-belly configuration on a printed circuit board (PCB) or card. That is, some optical transceivers are mounted on the top of the PCB and some optical transceivers are on mounted on the bottom of the PCB. The optical transceiver also plugs into a receptacle, also known as a cage. There also may be a heat sink on the top of each optical transceiver. The heat sinks are meant to ride on top of the optical transceiver so that the heat sinks have a physical contact with the optical transceiver once the optical transceiver is plugged into the cage. There has been a fair bit of thermal design work with these various form factors. However, the thermal designs are all for single height cages.

Some thermal solutions have been directed towards stacked cages. Stacked cages allow for two optical transceivers to sit on top of each other. The area between the stacked cages has a latching mechanism to hold the optical transceivers in place once they are inserted into the cages. The thermal solution that has been presented to date by suppliers for stacked cages has been to punch holes in the area between the two optical transceivers. The entire cage would then sit on a PCB. This thermal solution would likely work in a data communications environment where unfiltered air entering the PCB is acceptable. However, this thermal solution is not suitable in a telecommunication environment in which unfiltered air is unacceptable.

What is needed therefore is a mechanism to keep optoelectronic devices within their temperature operating limits.

The inventive features that are characteristic of the teachings, together with further objects and advantages, are better understood from the detailed description and the accompanying figures. Each of the figures is provided for the purpose of illustration and description only, and does not limit the present teachings.

SUMMARY

The following presents a simplified summary relating to one or more aspects and/or embodiments associated with the apparatus and methods disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the apparatus and methods disclosed herein in a simplified form to precede the detailed description presented below.

Example implementations of the disclosure are directed to cooling stacked, pluggable optical transceivers. In one or more implementations, an assembly for cooling an optical transceiver comprises an optical transceiver cage having a first wall and a second wall. The assembly includes a first thermally conductive device having a first end and a second end. The first end of the first thermally conductive device is coupled to the first wall of the optical transceiver cage. The assembly may include a second thermally conductive device having a first end and a second end. The first end of the second thermally conductive device is coupled to the second wall of the optical transceiver cage. The assembly may include a heat radiator having a first surface and a second surface. The second end of the first thermally conductive device is coupled to the first surface of the heat radiator. The second end of the second thermally conductive device is coupled to the second surface of the heat radiators. In one or more implementations, the thermally conductive device is a heat pipe. In one or more implementations, the heat radiator is a fin radiator.

This Summary is submitted with the understanding that it will not be used to interpret or limit the scope or meaning of the claims. This Summary is not intended to identify key features or essential features of the claimed subject matter, nor is it intended to be used as an aid in determining the scope of the claimed subject matter.

Other objects and advantages associated with the apparatus and methods disclosed herein will be apparent to those skilled in the art based on the accompanying drawings and detailed description.

BRIEF DESCRIPTION OF THE DRAWINGS

The accompanying drawings are presented to aid in the description of implementations of the technology described herein and are provided solely for illustration of the implementations and not limitation thereof.

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
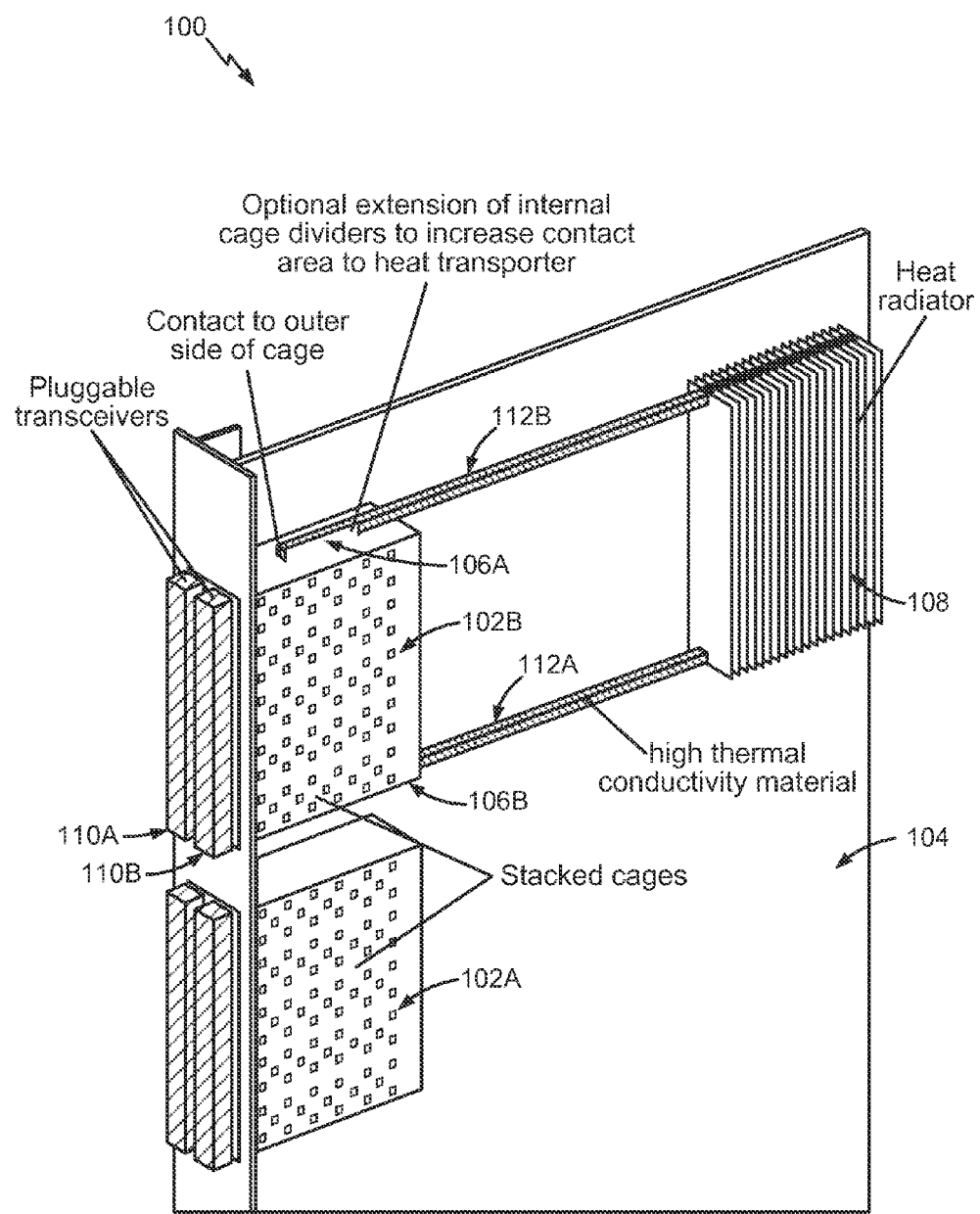
FIG. 1 is a diagram illustrating an external-to-cage optical transceiver cooling solution according to one or more implementations.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Methods, apparatus and systems for are provided. The exemplary methods, apparatus, and systems disclosed herein advantageously address the long-felt industry needs, as well as other previously unidentified needs, and mitigate shortcomings of the conventional methods, apparatus, and systems. For example, an advantage provided by the disclosed methods, apparatus, and systems herein is an improvement in cooling optical components.

Various aspects are disclosed in the following description and related drawings to show specific examples relating to exemplary embodiments of the disclosure. Alternate embodiments will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and embodiments disclosed herein.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular embodiments only and is not intended to be limiting of embodiments of the invention. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected"

or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

It should be understood that the term "signal" can include any signal such as a data signal, audio signal, video signal, multimedia signal, analog signal, and/or digital signal. Information and signals can be represented using any of a variety of different technologies and techniques. For example, data, an instruction, a process step, a command, information, a signal, a bit, and/or a symbol described in this description can be represented by a voltage, a current, an electromagnetic wave, a magnetic field and/or particle, an optical field and/or particle, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

In general, one implementation of the subject matter disclosed herein is directed to methods and apparatuses for cooling stacked, pluggable optical transceivers. In one or more implementations, the front or faceplate of the optical transceiver equipment is kept closed while heat is still being pulled from the cages. The first cage in a row of cages can be cooled fairly adequately with air flowing over the first cage. However, by the time the air reaches the subsequent cages along the length of the card, it becomes too hot to effectively cool the transceivers in the subsequent cages. Moreover, the cage is very large and as a result blocks a lot of air flow. Thus, once the air flows over the first cage it is deflected and the next cage down the line does not see as much air flow. Additionally, the limited air flow the next cage does see is preheated.

In one or more implementations, heat is moved from the cage towards the back of the card out of the shadow of the previous cage so that it can receive cool air. That is, the heat is transported to another area and projected into the air stream with a heat radiator, cooling fin, or the like.

Cooling according to one or more implementations is external to the cages of the pluggable transceivers. In this implementation, a highly thermally conductive material or device, such as a heat pipe, is attached to either or both sides of the cage by clamping or gluing the heat pipe to the cage. The highly thermally conductive heat pipe is long enough to contact a radiator in a cooler region of the PCB. The heat pipe(s) then becomes a heat transporter carrying heat from the optical transceivers to the cooler region of the PCB. The effectiveness of this technique can be enhanced by making portions of the cage out of a highly thermally conductivity material and/or by extending the dividers that separate the top and bottom optical transceivers outside the cage so there is more surface area of the cage in contact with the heat transporter.

FIG. 1 is a diagram illustrating an external-to-cage optical transceiver cooling assembly 100 according to one or more implementations. The assembly 100 includes stacked cages 102a and 102b mounted to a printed circuit board (PCB) 104. There are dividers 106a and 106b in cage 102b to separate the optical transceivers from each other in a cage. A heat radiator 108 also is mounted on the PCB 104. Pluggable optical transceivers 110a and 110b are inserted in the cage 102b. Cooling devices (e.g., heat pipes) 112a and 112b are coupled to the heat radiator 108 and the cage 102b.

Although described as cooling optical transceivers, implementations are not so limited. For example, the cooling assemblies described herein can be used to cool other electronic components (e.g., small form-factor electronic and/or optical input/output (I/O) devices).

In one or more implementations, the stacked cages 102 can be CFP cages, CFP2 cages, SFP cages, QSFP cages, QSFP+ cages, CXP cages, and the like. The stacked cages can be any suitable enclosure (typically, but not necessarily, metal) to house the pluggable optical transceivers 110. In one or more implementations, the cages 102a and 102b are made from highly thermally conductive material(s).

In one or more implementations, the PCB 104 can be any suitable mechanism that mechanically supports and electrically connects the components located on the PCB 104.

In one or more implementations, the dividers 106a and 106b can be any suitable mechanism that separates the optical transceivers from each other in a cage. In the illustrated implementation, the cage 102b is modified so that the divider 106a on the top of the cage 102b and the divider 106b on the bottom of the cage 102b are extended outside of the cage 102b so that the heat pipes 112a and 112b, respectively, can be inserted therein. Extending the dividers 106a and 106b outside of the cage 102b exposes more surface area of the cage 102b for contact with the high thermal conductivity heat pipes 112a and 112b. More contact surface area allows better transfer of heat into the high thermal conductivity heat pipes 112a and 112b so the high thermal conductivity heat pipes 112a and 112b can transfer more heat back into the cooling part of the PCB 104.

In one or more implementations, the heat radiator 108 can be any suitable component that serves to transfer thermal energy from one location to another location by conduction, convection, radiation, or the like. As used herein, the term "heat radiator" is meant to include any heat sink, passive heat exchanger, fin, or the like. The heat radiator may be made from any high thermal conductivity material, such as aluminum, copper, diamond, alloys, or composite materials. The heat radiator 108 may be coupled to the PCB 104 using thermal adhesive, thermal grease, or the like.

In one or more implementations, the optical transceivers 110 can be any suitable optical transceivers that are capable of transmitting and/or receiving optical signals. The optical transceivers 110 are configured to be inserted or plugged into cages 102, e.g., CFP cages, CFP2 cages, SFP cages, QSFP cages, QSFP+ cages, CXP cages, and the like.

In one or more implementations, the heat pipes 112a and 112b are heat pipes or vapor chambers made from high thermal conductivity material. For example, heat pipes 112a and 112b are heat transfer devices that combine the principles of thermal conductivity and phase transformation. At a hot interface within the heat pipe, a liquid that is in contact with a thermally conductive solid surface of the heat pipe turns into a vapor by absorbing heat from the thermally conductive solid surface. The vapor then travels along the heat pipe to a cold interface, condenses back into liquid, releasing the latent heat. The liquid then returns to the hot interface either via capillary action or gravity, where it evaporates once more and repeats the cycle. In the illustrated implementation, the high thermal conductivity heat pipes 112a and 112b contact the cage 102b external to the cage 102b. In one implementation, the high thermal conductivity heat pipes 112a and 112b can be adhered to the outside of the cage 102b using an adhesive, a clamp, or other suitable mechanism.

In some implementations, more cooling can be achieved by placing high thermal conductivity heat pipes inside the stacked cage. For example, the heat transporting material or device (e.g., heat pipe) may be inserted inside the cage in the area that divides the stacked transceivers. This cooling mechanism can be enhanced by ensuring the heat pipe is in contact with the dividers of the cage and inserted into the cage between the back connectors to minimize the distance between cages. The high thermal conductivity heat pipe is small enough to fit between the optical transceiver connectors at the back of the cage, (e.g., approximately 3 mm in diameter). Modifications to a traditional cage can include adding holes at the back of the cage for the heat pipe and modifying the shape of the internal vertical dividers to accommodate the heat pipe. The heat pipe can be inserted into the cage from the side.

With this implementation there should be enough distance between cages to allow for bending of the heat pipe. This implementation also allows for integrating the heat pipe and heat radiator into a manufactured cage. Initial analysis estimates the improvement of cooling over the external-to-cage solution illustrated in FIG. 1 to be 25% to 40%.

Figure 2A:
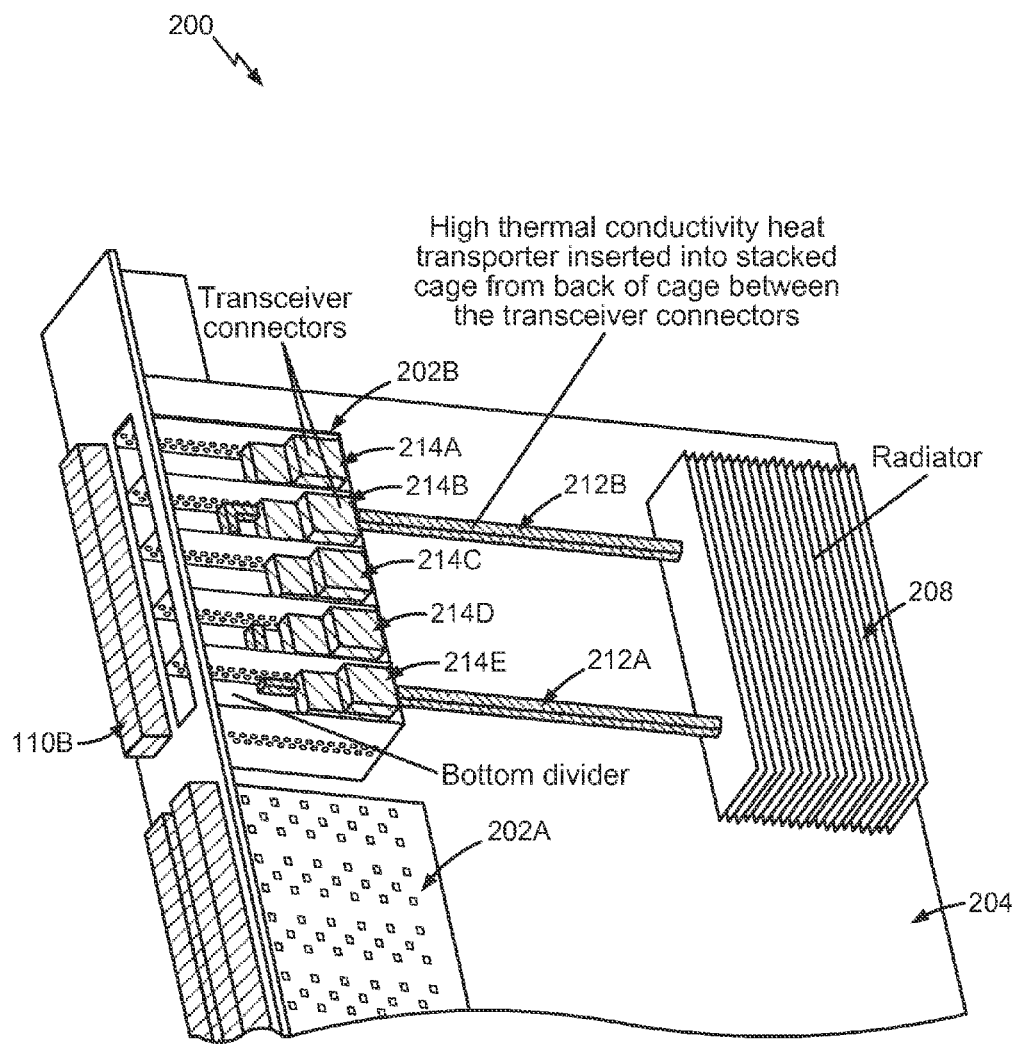
FIG. 2A is a diagram illustrating an internal-to-cage optical transceiver cooling solution according to one or more implementations.

FIG. 2A is a diagram illustrating an internal-to-cage optical transceiver cooling assembly 200 according to one or more implementations. For purposes of clarity, the top of the cage and the top transceivers are not shown. The solution 200 includes stacked cages 202a and 202b mounted to a printed circuit board (PCB) 204. There are dividers 206a and 206b on cage 202b to separate the pluggable optical transceivers from each other in a cage. A heat radiator 208 also is mounted on the PCB 204. Pluggable optical transceiver 110b is inserted in cage 202b. For purposes of clarity, optical transceiver 110a is not shown. Heat pipes 212a and 212b are coupled to the heat radiator 208 and the cage 202b. Optical transceivers 110a and 110b are plugged into optical transceiver connectors 214a, 214b, 214c, 214d, and 214e.

In the illustrated implementation, heat pipe 212a enters the cage 202b between the optical transceiver connectors 214a and 214b. Additionally, heat pipe 212b enters the cage 202b between the optical transceiver connectors 214d and 214e. The heat pipes 212a and 212b can be bent, straight, bent around to try to increase the contact area to the heat within the cage 202b, either indirectly through the air that is warm inside the cage 202b or by physically contacting the cage 202b walls themselves to transfer heat to the heat radiator 208 at the back of the PCB 204.

In alternative implementations, holes are created in the sides of the cage 202b, which would bring the heat pipes 212a and 212b in through the side walls of the cage 202b, in through the cage 102b dividers, and back out again.

Figure 2B:
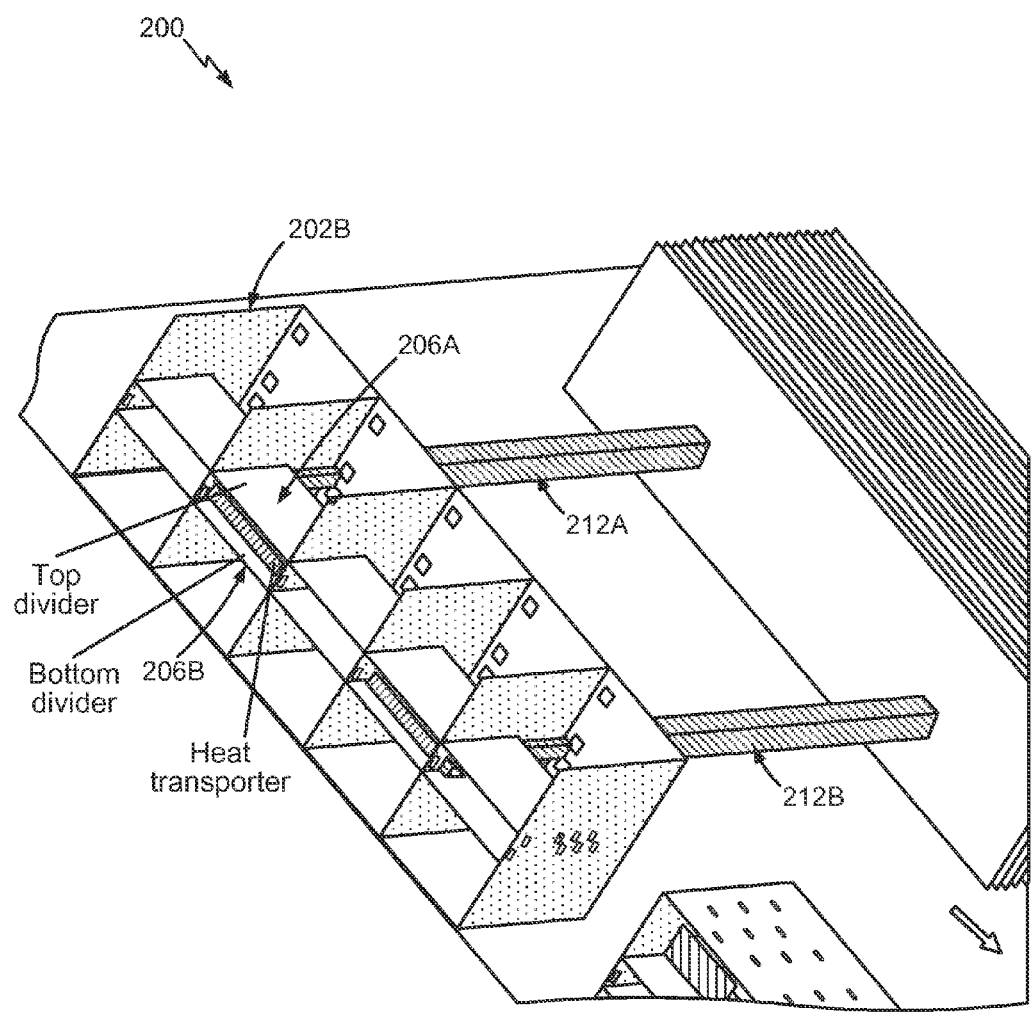
FIG. 2B is a cut-away view of the internal-to-cage optical transceiver cooling solution depicted in FIG. 2A according to one or more implementations.

FIG. 2B is a cut-away view of the internal-to-cage heat transporter assembly 200 according to one or more implementations. In the illustrated view, it can be seen how the high thermal conductivity heat pipes 212a and 212b sit between the top and bottom dividers 206a and 206b of the cage 202b where the top and bottom optical transceivers would plug into.

Figure 3:
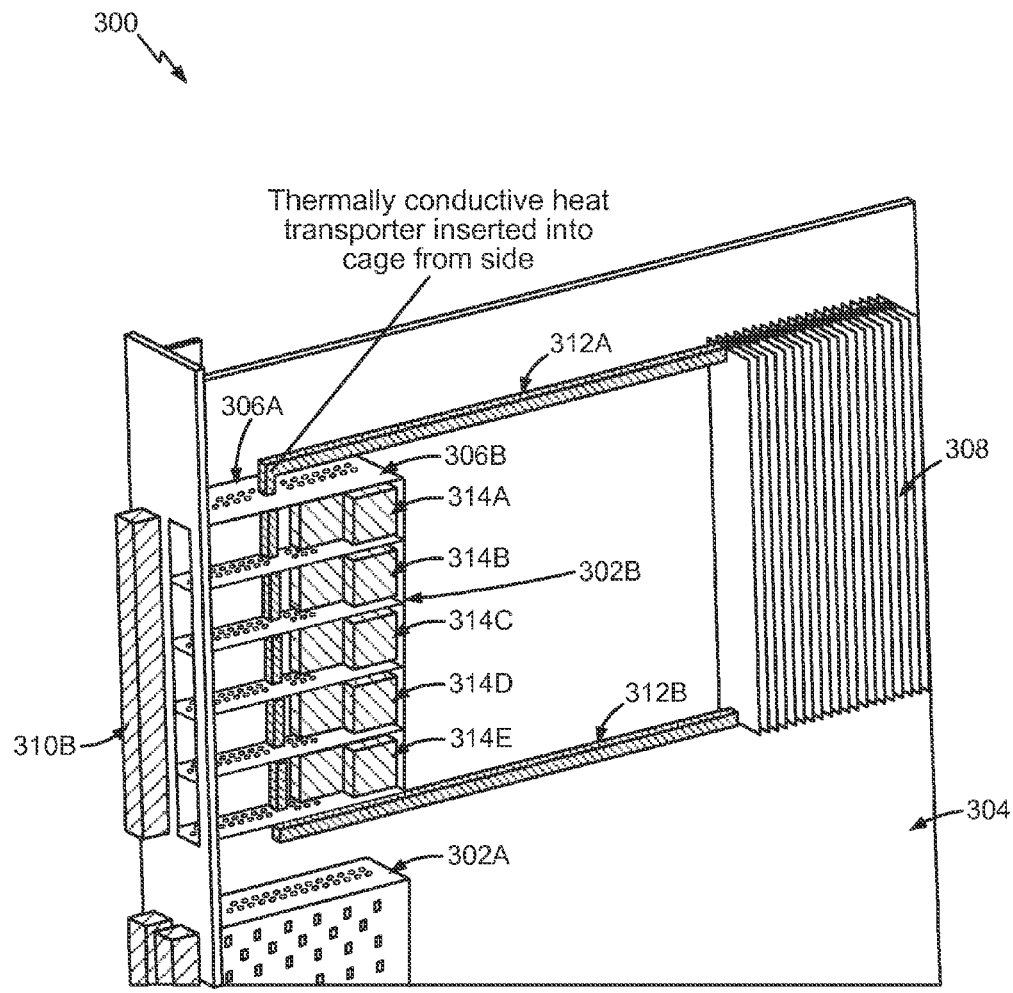
FIG. 3 is a diagram illustrating an internal-to-cage optical transceiver cooling solution according to one or more alternative implementations.

FIG. 3 is a diagram illustrating an internal-to-cage optical transceiver cooling assembly 300 according to one or more alternative implementations in which the heat pipe is inserted from the side of the optical transceiver cage. The cooling assembly 300 includes stacked cages 302a and 302b mounted to a printed circuit board (PCB) 304. There are dividers 306a and 306b on cage 302b to separate the pluggable optical transceivers from each other in a cage. A heat radiator 308 also is mounted on the PCB 304. Heat pipes 312a and 312b are coupled to the heat radiator 308 and the cage 302b. Optical transceivers 310a and 310b are plugged into optical transceiver connectors 314a, 314b, 314c, 314d, and 314e. For purposes of clarity, the top of the cage 302b, the top divider, and the top transceivers are not shown.

In the illustrated implementation, instead of bringing the heat pipes 312a and 312b from the back of the transceiver module 300 between the optical transceiver connectors 314a, 314b, 314c, 314d, and 314e the heat pipes 312a and 312b are inserted through the sides of the cage 302b. The heat radiator 308 is directly behind the cage 302b itself.

In alternative implementations, cages 302a and 302b can be coupled to a liquid that is flowing through the heat pipes 312a and 312b as opposed to using heat pipes made from high thermal conductivity materials.

Implementations of the technology described herein are disclosed in the above description and related drawings directed to specific embodiments. Alternative implementations may be devised without departing from the scope of the invention. Additionally, well-known elements of the invention have not been described in detail or were omitted so as not to obscure the relevant details of the invention.

The term "embodiments of the invention" or "implementations" does not require that all embodiments or implementations of the invention include the discussed feature, advantage or mode of operation.

Embodiments of the methods, apparatus, and systems described herein can be used in a number of applications. For example, the described embodiments could be used in telecommunication service centers and data communication centers. Further applications should be readily apparent to those of ordinary skill in the art.

Nothing stated or illustrated depicted in this application is intended to dedicate any component, step, feature, object, benefit, advantage, or equivalent to the public, regardless of whether the component, step, feature, object, benefit, advantage, or the equivalent is recited in the claims.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

Although some aspects have been described in connection with a device, it goes without saying that these aspects also constitute a description of the corresponding method, and so a block or a component of a device should also be understood as a corresponding method step or as a feature of a method step. Analogously thereto, aspects described in connection with or as a method step also constitute a description of a corresponding block or detail or feature of a corresponding device. Some or all of the method steps can be performed by a hardware apparatus (or using a hardware apparatus), such as, for example, a microprocessor, a programmable computer or an electronic circuit. In some exemplary embodiments, some or a plurality of the most important method steps can be performed by such an apparatus.

The exemplary embodiments described above merely constitute an illustration of the principles of the present disclosure. It goes without saying that modifications and variations of the arrangements and details described herein will become apparent to other persons skilled in the art. Therefore, it is intended that the disclosure be restricted only by the scope of protection of the appended patent claims, rather than by the specific details presented on the basis of the description and the explanation of the exemplary embodiments herein.

In the detailed description above it can be seen that different features are grouped together in exemplary embodiments. This manner of disclosure should not be understood as an intention that the claimed exemplary embodiments require more features than are explicitly mentioned in the respective claim. Rather, the situation is such that inventive content may reside in fewer than all features of an individual exemplary embodiment disclosed. Therefore, the following claims should hereby be deemed to be incorporated in the description, wherein each claim by itself can stand as a separate exemplary embodiment. Although each claim by itself can stand as a separate exemplary embodiment, it should be noted that—although a dependent claim can refer in the claims to a specific combination with one or a plurality of claims—other exemplary embodiments can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective steps or actions of this method.

Furthermore, in some exemplary embodiments, an individual step/action can be subdivided into a plurality of sub-steps or contain a plurality of sub-steps. Such sub-steps can be contained in the disclosure of the individual step and be part of the disclosure of the individual step.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An assembly for cooling an optical transceiver, comprising:
    an optical transceiver cage having a first side wall, a second side wall, a back wall, and a vertical divider, the vertical divider extending from the first side wall to the second side wall;
    a first thermally conductive device having a first end and a second end, wherein the first end of the first thermally conductive device is coupled to the first side wall of the optical transceiver cage;
    a second thermally conductive device having a first end and a second end, wherein the first end of the second thermally conductive device is coupled to the second side wall of the optical transceiver cage; and
    a heat radiator spaced from the optical transceiver cage, wherein the second end of the first thermally conductive device is coupled to the heat radiator, and wherein the second end of the second thermally conductive device is coupled to the heat radiator.

2. The assembly of claim 1, wherein the thermally conductive device is a heat pipe.

3. The assembly of claim 2, wherein the heat pipe is a solid composition.

4. The assembly of claim 2, wherein the heat pipe is partially solid and partially liquid.

5. The assembly of claim 1, wherein the heat radiator is a fin radiator.

6. The assembly of claim 1, wherein the heat radiator further comprises a first surface and a second surface opposite the first surface.

7. The assembly of claim 6, wherein the second end of the first thermally conductive device is coupled to the first surface of the heat radiator and the second end of the second thermally conductive device is coupled to the second surface of the heat radiator.

8. The assembly of claim 1, wherein the vertical divider extends outside the optical transceiver cage beyond the first side wall.

9. The assembly of claim 8, wherein the first end of the first thermally conductive device is coupled to the vertical divider.

10. The assembly of claim 9, wherein the vertical divider extends outside the optical transceiver cage beyond the second side wall.

11. The assembly of claim 10, wherein the first end of the second thermally conductive device is coupled to the vertical divider.

12. An assembly for cooling an optical transceiver, comprising:
an optical transceiver cage having a first side wall, a second side wall, a back wall, and a vertical divider, the vertical divider extending from the first side wall to the second side wall;
a first thermally conductive device having a first end and a second end, wherein the first end of the first thermally conductive device is coupled to the back wall of the optical transceiver cage;
a second thermally conductive device having a first end and a second end, wherein the first end of the second thermally conductive device is coupled to the back wall of the optical transceiver cage; and
a heat radiator spaced from the optical transceiver cage, wherein the second end of the first thermally conductive device is coupled to the heat radiator, and wherein the second end of the second thermally conductive device is coupled to the heat radiator.

13. The assembly of claim 12, wherein the first thermally conductive device extends through the back wall and is coupled to the vertical divider, and the second thermally conductive device extends through the back wall and is coupled to the vertical divider.

14. The assembly of claim 12, wherein the thermally conductive device is a heat pipe.

15. The assembly of claim 14, wherein the heat pipe is a solid composition.

16. The assembly of claim 15, wherein the heat pipe is partially solid and partially liquid.

17. An assembly for cooling an optical transceiver, comprising:
a cage means for supporting and separating a plurality of optical transceivers;
a first thermally conductive means for conducting heat, the first thermally conductive means is coupled to the cage means;
a second thermally conductive means for conducting heat, the second thermally conductive means is coupled to the cage means;
a heat dissipation means for storing and dissipating heat, the heat dissipation means being spaced from the cage means, and wherein the first thermally conductive means is coupled to the heat dissipation means and wherein the second thermally conductive means is coupled to the heat dissipation means; and
a divider means within the cage means for separating the plurality of optical transceivers, wherein the first thermally conductive means extends into the cage means and is coupled to the divider means and the second thermally conductive means extends into the cage means and is coupled to the divider means.

18. The assembly of claim 17, wherein the first thermally conductive means is coupled to the second thermally conductive means within the cage means.

* * * * *